United States Patent [19]
Mitsui

[11] Patent Number: 6,042,752
[45] Date of Patent: Mar. 28, 2000

[54] TRANSPARENT CONDUCTIVE FILM, SPUTTERING TARGET AND TRANSPARENT CONDUCTIVE FILM-BONDED SUBSTRATE

[75] Inventor: Akira Mitsui, Yokohama, Japan

[73] Assignee: Asahi Glass Company Ltd., Tokyo, Japan

[21] Appl. No.: 09/175,964

[22] Filed: Oct. 21, 1998

Related U.S. Application Data

[63] Continuation-in-part of application No. PCT/JP98/00708, Feb. 20, 1998.

[30] Foreign Application Priority Data

Feb. 21, 1997 [JP] Japan ......................... 9-038133

[51] Int. Cl.$^7$ .................. H01B 1/06; C23C 14/00
[52] U.S. Cl. ............. 252/520.1; 252/512; 252/518.1; 252/521.1; 204/191.1; 204/298.12; 204/298.13
[58] Field of Search .................. 252/512, 518.1, 252/519.1, 519.15, 520.1, 521.1; 204/191.1, 298.12, 298.13

[56] References Cited

U.S. PATENT DOCUMENTS 5,473,456 12/1995 Cava et al. ..................... 359/87

FOREIGN PATENT DOCUMENTS

| | | |
|---|---|---|
| 63-178414 | 7/1988 | Japan . |
| 4-272612 | 9/1992 | Japan . |
| 4-277408 | 10/1992 | Japan . |
| 7-335030 | 12/1995 | Japan . |
| 8-264022 | 10/1996 | Japan . |
| 9-259640 | 10/1997 | Japan . |

OTHER PUBLICATIONS

Edwards, D.D. et al, "A New Transparent Conducting Oxide in the $Ca_2O_3$–$In_2O_3$–$SnO_2$ System", vol. 70, No. 13, Applied Physics Letters (USA) American Institute of Physics (1997), p. 1706–1708.

*Primary Examiner*—Mark Kopec
*Assistant Examiner*—D. Hamlin
*Attorney, Agent, or Firm*—Oblon, Spivak, McCelland, Maier & Neustadt, P.C.

[57] ABSTRACT

A transparent conductive film of tin oxide containing gallium and indium, which contains, when gallium is calculated as $Ga_2O_3$, indium is calculated as $In_2O_3$ and tin is calculated as $SnO_2$, gallium in an amount of from 0.1 to 30 mol % and indium in an amount of from 0.1 to 30 mol %, based on the total amount of $Ga_2O_3$, $In_2O_3$ and $SnO_2$, a sputtering target and a transparent conductive film bonded substrate. The transparent conductive film of the present invention exhibits chemical resistance and abrasion resistance.

13 Claims, 1 Drawing Sheet

TRANSPARENT CONDUCTIVE FILM, SPUTTERING TARGET AND TRANSPARENT CONDUCTIVE FILM-BONDED SUBSTRATE

This application is a continuation-in-part (CIP) application of PCT/JP98/00708, filed Feb. 20, 1998.

BACKGROUND OF THE INVENTION

1. Field of the Invention

The present invention relates to a transparent conductive film, a sputtering target and a transparent conductive film-bonded substrate.

2. Description of the Background

A transparent conductive film has both high visible light transmittance and high electrical conductivity and is widely used as a transparent electrode for a display device, such as a liquid crystal display device or a plasma emission device, as a transparent electrode for a solar cell, as a heat reflecting film for an automobile or building glass, as an antistatic film for CRT or as a transparent heater for various antifogging devices, including refrigerating show cases.

As such a transparent conductive film, an ITO (tin-doped indium oxide) film has been mainly employed, since a low resistance film can readily be obtainable, thereby. Particularly, the ITO film is widely used as an electrode for a display device. As other films, a zinc oxide type transparent conductive film and a tin oxide type transparent conductive film of low cost having high chemical resistance are known.

Such conventional transparent conductive film materials are disadvantageous in that with ITO, indium as their main component thereof is expensive and constitutes a bar against cost reduction. With the zinc oxide type transparent conductive film, the chemical resistance thereof against acid or alkali is poor and it is, accordingly, difficult to apply a zinc oxide type transparent conductive film to an industrial product, such as a display device.

The tin oxide type transparent conductive film has excellent chemical resistance, as compared with the ITO film or the zinc oxide type transparent conductive film.

The tin oxide type film is prepared by a spray method or a CVD method as an industrial method for its production, but it is difficult to form the film to have a uniform thickness. Further, during the film formation, chorine, hydrogen chloride, etc. are formed, whereby there used to be an environmental problem due to such a waste gas (or a waste liquid). The tin oxide type transparent conductive film is useful and on the other hand has such various problems.

Further, the tin oxide type transparent conductive film is crystalline, whereby the scratch resistance thereof is poor. The reason for such poor scratch resistance is considered to be due to the face that the film surface has fine irregularities formed during the crystal growth which tend to cause scratching.

In general a sputtering method is suitable for forming a film with a large area whereby a uniform thin film can readily be obtained, and little environmental pollution occurs thereby.

Sputtering methods may generally be classified into a radio frequency (RF) sputtering method using a high frequency power source and a direct current (DC) sputtering method using a direct current power source. The RF sputtering method is excellent in that an electrically insulating material can be used as the target, but the high frequency power source is costly, has a complex structure and is not preferred for forming a film with a large area.

In the DC sputtering method, the target material is limited to a material having good electrical conductivity, but the operation thereof is easy as a direct current power source may be used whereby the required apparatus is simple. As an industrial film-forming method, the DC sputtering method is preferred. JP-A-197315 proposes a method for forming a tin oxide conductive film by a sputtering method, but the description is limited to a RF sputtering method, and there is no description with respect to a DC sputtering method. Further, only a film having a relatively high resistance i.e. the resistivity of the film being at least $8\times10^{-3}\Omega cm$, is thereby obtainable.

Further, JP-A-7-335030 proposes a transparent conductive oxide containing one member or a plurality of members selected from the group consisting of $In_2O_3$, ZnO, $SnO_2$ and $Ga_2O_3$. However, there is no specific description of a composite oxide containing tin oxide Further, JP-A-4-272612 proposes an ITO film containing gallium, but indium oxide is the main component, and tin oxide is not the main component.

Thus, a need exists for a tin oxide type-transparent conductive film having both low resistance and high scratch resistance as well as a method for its production.

SUMMARY OF THE INVENTION

Accordingly, it is an object of the present invention to provide a tin oxide type transparent conductive film having low resistance and high scratch resistance.

It is also an object of the present invention to provide a method for the production of the tin oxide type transparent conductive film, and a sputtering target for forming the tin oxide type transparent conductive film.

The above object and others are provided by a transparent conductive firm of tin oxide containing gallium and indium, which contains, when gallium is calculated as $Ga_2O_3$, indium is calculated as $In_2O_3$ and tin is calculated as $SnO_2$, gallium in an amount of from 0.1 to 30 mol % and indium in an amount of from 0.1 to 30 mol% based on the total amount of $Ga_2O_3$, $In_2O_3$ and $SnO_2$.

BRIEF DESCRIPTION OF THE DRAWINGS

The drawing shows an X-ray diffraction pattern of the film of Example 2 of the present specification.

DETAILED DESCRIPTION OF THE PREFERRED EMBODIMENTS

Figure 1:
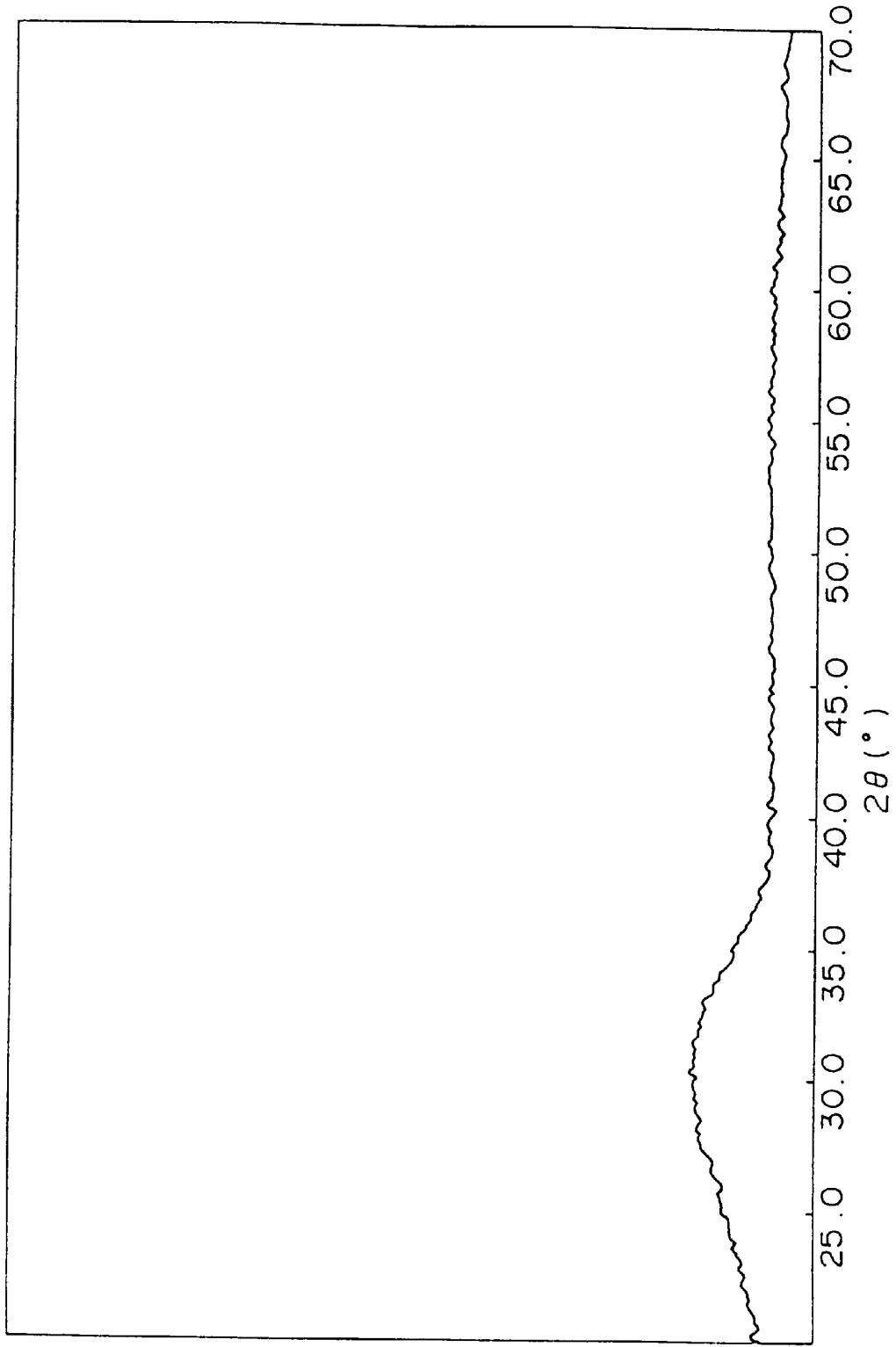

The following definitions of gallium and indium content apply in the present invention and are used in this specification as defined herein below.

If the content of either gallium or indium is less than about 0.1 mol % as calculated as the oxide, the resistivity of the film tends to be high, and the film tends to be crystalline. Further, if the content of either one is larger than about 30 mol % as calculated as the oxide, the resistivity of the film tends to be high. In order to obtain a film having a lower electrical resistance, it is preferred that the content of gallium be from about 1 to 15 mol % as calculated as $Ga_2O_3$, and that the content of indium be from about 1 to 15 mol % as calculated as $In_2O_3$.

Further, in order to obtain a film having a lower electrical resistance, it is preferred that antimony and/or tellurium also be contained therein. Antimony is calculated as $Sb_2O_5$ and tellurium as calculated as $TeO_2$, are preferably contained in a total amount within a range of from about 0.01 to 10 mol %, based on the total amount also including $Ga_2O_3$, $In_2O_3$ and $SnO_2$. If the total amount used is larger than 10 mol %, the resistance tends to be high. On the other hand, if the total amount used is less than 0.01 mol %, the effect for lowering the resistance tends to be small. The contents of antimony and/or tellurium, are as thus defined and are used as such herein below.

In order to improve scratch resistance, the transparent conductive film of the present invention preferably also contains at least one metal (hereinafter referred to as a Group 3–5 metal) of Group 3 (inclusive of lanthanoids and not inclusive of actinoids), Group 4 and Group 5 of the long-form Periodic Table.

The Group 3–5 metal is preferably contained in the film in the form of an oxide (hereinafter referred to as a Group 3–5 metal oxide). The Group 3–5 metal oxide is preferably contained in a total amount of from about 0.05 to 5 mol %, based on the total-amount including $SnO_2$, $In_2O_3$ and $Ga_2O_3$. If it is less than about 0.05 mol %, the effect for improving the scratch resistance tends to be small. On the other hand, if it exceeds about 5 mol %, the resistivity of the film tends to be high.

Calculation of the content of the Group 3–5 metal oxide is carried out on the basis of oxides (as mentioned hereinafter) exemplified as the Group 3–5 metal oxide. With respect to the definition of the content of the Group 3–5 metal oxide, the same applies hereinafter.

As the Group 3 metals, Sc, Y and lanthanoids (La, Ce, Pr, Nd, Pm, Sm. Eu, Gd, Tb, Dy, Ho, Er, Tm, Yb and Lu) may be mentioned. Particularly, Y, La, Ce, Pr and Nd are preferred in view of the relatively low prices and high chemical resistance thereof.

As the Group 3 metal oxide, $Sc_2O_3$, $Y_2O_3$, $La_2O_3$, $CeO_2$, $Pr_6O_{11}$, $Nd_2O_3$, $Pm_2O_3$, $Sm_2O_3$, $Eu_2O_3$, $Gd_2O_3$, $Tb_4O_7$, $Dy_2O_3$, $Ho_2O_3$, $Er_2O_3$, $Tm_2O_3$, $Yb_2O_3$ and $Lu_2O_3$ may be mentioned.

As the Group 4 metal, Ti, Zr and Hf may be mentioned. Particularly, Ti and Zr are preferred in view of the relatively low prices and high chemical resistance thereof.

As the Group 4 metal oxide, $TiO_2$, $ZrO_2$ and $HfO_2$ may be mentioned.

As the Group 5 metal, V, Nb and Ta may be mentioned. Particularly, Nb and Ta are preferred in view of the relatively low prices and high chemical resistance thereof.

The Group 5 oxide may be $V_2O_5$, $Nb_2O_5$ and $Ta_2O_5$.

The resistivity of the transparent conductive film of the present invention is preferably not higher than about 1 $\Omega$cm from the practical viewpoint. On the other hand, if the resistivity is too small. The film thickness required to obtain a predetermined resistance tends to be too thin, whereby it will be difficult to obtain a continuous film. Accordingly, the resistivity is preferably at least about $10^{-5}$ $\Omega$cm.

The visible light transmittance of the transparent conductive film of the present invention is preferably at least about 70% from the practical viewpoint.

The present invention further provides a sputtering target of tin oxide containing gallium and indium, which contains, when gallium is calculated as $Ga_2O_3$, indium is calculated as $In_2O_3$ and tin is calculated as $SnO_2$, gallium in an amount of from 0.1 to 30 mol % and indium in an amount of from 0.1 to 30 mol % based on the total amount of $Ga_2O_3$, $In_2O_3$ and $SnO_2$.

If the content of either gallium or indium is less than about 0.1 mol % as calculated as the oxide, the resistivity of the formed film tends to be high, and the film tends to be crystalline. Further, if the content of either one is larger than about 30 mol % as calculated as the oxide, the resistivity of the film tends to be high.

In order to obtain a film having a lower electrical resistance, it is preferred that the content of gallium is from about 1 to 15 mol % as calculated as $Ga_2O_3$, and the content of indium is from about 1 to 15 mol % as calculated as $In_2O_3$.

Further, the target of the present invention preferably contains antimony and/or tellurium, whereby a film having a lower electrical resistance can be obtained. Antimony as calculated as $Sb_2O_5$ and tellurium as calculated as $TeO_2$, are preferably contained in a total amount within a range of from about 0.01 to 10 mol %, based on the total amount of $Sb_2O_5$, $TeO_2$, $Ga_2O_3$, $In_2O_3$ and $SnO_2$. If it is larger than 10 mol%, the resistance of the target and the obtainable film tends to be high. Further, the density (high densification) of the target tends to be low, and the discharge during the sputtering tends to be instable. Further, if it is less than about 0.01 mol %, the effect for reducing the electrical resistance tends to be small.

In order to make stabilized sputtering possible, the relative density of the target is preferably at least about 80%. Namely, the density of the target is preferably at least 5.5 g/cc.

Further, it is preferred that the above Group 3–5 metal is contained, since a target having a higher density can thereby be obtained. The Group 3–5 metal is preferably contained in the target in the form of an oxide (i.e. a Group 3–5 metal oxide).

Specific examples of the Group 3–5 metal and the Group 3–5 metal oxide are the same as described above.

The Group 3–5 metal oxide is preferably contained in a total amount of from about 0.05 to 5 mol %, based on the total amount including $SnO_2$, $In_2O_3$ and $Ga_2O_3$. If it is less than about 0.05 mol % or more than about 5 mol %, the density of the target tends to be low.

In order to carry out stabilized sputtering discharge, the resistivity of the sputtering target is preferably not higher than about 1 $\Omega$cm.

Gallium in the target is preferably present in the form of an oxide or a solid solution. Here, in the form of an oxide means in the form of gallium trioxide ($Ga_2O_3$), or in the form of a composite oxide with indium oxide ($In_2O_3$) and/or tin oxide ($SnO_2$). In the form of a solid solution means in the form of tin oxide ($SnO_2$) having gallium solid-solubilized therein and/or indium oxide ($In_2O_3$) having gallium solid-solubilized therein. It is particularly preferred that gallium is present in such a state that the major portion thereof is solid-solubilized in $SnO_2$ or $In_2O_3$.

Indium in the target is preferably present in the form of an oxide or a solid solution. Here, in the form of an oxide means in the form of $In_2O_3$ ($SnO_2$ or $Ga_2O_3$ may be solid-solubilized therein) or in the form of a complex oxide with $SnO_2$ and/or $Ga_2O_3$. In the form of a solid solution means in the form of $SnO_2$ having indium solid-solubilized therein and/or $Ga_2O_3$ having indium solid-solubilized therein. It is particularly preferred that indium is present in such a state that the major portion thereof is $In_2O_3$ ($SnO_2$ or $Ga_2O_3$ may be solid-solubilized therein) or in a solid state solubilized in $SnO_2$.

Gallium and indium are preferably present in the form of an oxide or a solid solution, since a transparent conductive film can thereby readily be prepared. However, they may be contained in a form other than an oxide or a solid solution, such as in a form of a metal, carbide or nitride, to such an extent not to impair the purpose of the present invention.

In a case where gallium and indium in the sputtering target are present in the form of oxides, the maximum particle size of crystal particles of such oxides is preferably at most about 200 μm. If oxide particles with the maximum particle size being larger than 200 μm, are present, sputtering discharge tends to be instable, such being undesirable. Further, the average particle size is preferably at least about 0.01 μm from the viewpoint of handling efficiency of the powder and the moldability. Further, if the average particle size exceeds 50 μm, the sinterability tends to be poor, whereby a dense sintered body can hardly be obtained. Accordingly, the average particle size is preferably at most about 50 μm.

Other components may be contained in the target of the preset invention to such an extent not to impair the purpose and the effects of the present invention, but their amount should better be as small as possible.

The composition of the film corresponds substantially to the composition of the target. However, depending upon e.g. the sputtering conditions during film-formation, the composition of the film may be different from the composition of the target.

The target of the present invention can be prepared by a common method for preparing ceramics such as an atmospheric pressure sintering method or a hot pressing method.

In the case of atmospheric pressure sintering, sintering at a high temperature will be required, and at a high temperature, the oxide is likely to be decomposed or evaporated, whereby the target tends to be hardly densified. Accordingly, it is preferred to carry out sintering in an atmosphere containing oxygen, such as air. For example, atmospheric sintering is carried out in air at a temperature of from about 1,300 to 1,600° C.

In the case of hot pressing, sintering can be carried out at a relatively low temperature, and either an oxidizing atmosphere (an atmosphere containing an oxidizing gas) or a nonoxidizing atmosphere (an atmosphere containing no oxidizing gas) may accordingly be used. In the case of hot pressing, it is common to employ carbon as the mold material, and with a view to preventing oxidation of the mold material, it is preferred to carry out the hot pressing in a nonoxidizing atmosphere. For example, hot pressing is carried out in a non-oxidizing atmosphere at a temperature of from about 800 to 1,100° C.

In the case of the above-mentioned atmospheric pressure sintering in air, a target can be prepared, for example, as follows. $Ga_2O_3$ powder, $In_2O_3$ powder and $SnO_2$ powder are prepared, and these powders are mixed in a predetermined ratio. At that time, using water as a dispersing agent, mixing is carried out by a wet system ball mill method. Then, the obtained powder is dried and then filled in a rubber mold and press-molded under a pressure of about 1,500 kg/cm$^2$ by a cold isotropic pressing apparatus (CIP apparatus). Then, the molded product is baked at a temperature of about 1,500° C. for 2 hours in atmospheric air to obtain a sintered body. This sintered body is machined into a predetermined size to obtain a target material. This target material is metal-bonded to a backing plate made of a metal such as copper to obtain a target.

On the other hand, in the case of the hot pressing, a target can be prepared, for example, as follows. In the same manner as in the case of the atmospheric pressure sintering, the starting material powders are mixed and dried, and then the obtained powder is filled in a hot press die made of carbon and held at a temperature of about 900° C. under a pressure of about 300 kg/cm$^2$ for 2 hours in argon (Ar) for sintering. Thereafter, machining and metal bonding are carried out in the same manner as in the case of the atmospheric pressure sintering, to obtain a target.

The target of the present invention has high electrical conductivity, and it is sufficiently useful not only for a DC sputtering method whereby formation of a film with a large area is possible and, wherein the film forming speed is high, but also for any sputtering method such as a RF sputtering method.

Of the transparent conductive film of the present invention, the geometrical film thickness (hereinafter referred to simply as the film thickness) is preferably within a range of from about 3 nm to 5 μm. If the film thickness exceeds about 5 μm, the film-forming time tends to be long, whereby the cost increases. If the film thickness is thinner than about 3 nm, the resistivity tends to be high. Particularly preferred is within a range of from about 3 to 300 nm.

The present invention also provides a method for producing a transparent conductive film characterized by using the above-mentioned sputtering target as a sputtering target in a method for producing a transparent conductive film containing tin oxide as the main component, on a substrate by a sputtering method.

In the present invention, it is preferred to carry out sputtering in an oxidizing atmosphere. The oxidizing atmosphere is an atmosphere containing an oxidizing gas.

The oxidizing gas means an oxygen atom-containing gas such as $O_2$, $H_2O$, CO or $CO_2$. The concentration of the oxidizing gas is substantially influential over the properties of the film such as the electrical conductivity and light transmittance of the film.

Accordingly, it is necessary to optimize the concentration of the oxidizing gas depending upon the apparatus and the condition used, such as the substrate temperature and the sputtering pressure.

As the gas for sputtering, an Ar–$O_2$ system or an Ar–$CO_2$ system is preferred from a viewpoint such that the composition of the gas can easily be controlled when a transparent film having a low electrical resistance is to be prepared. Particularly preferred is an Ar–$CO_2$ system in view of the excellent controllability.

In the Ar–$O_2$ gas system, the $O_2$ concentration is preferably from about 5 to 25 vol %, as a transparent film having a low electrical resistance can thereby be obtained. If it is less than 5 vol %, the film tends to be colored yellow and the resistance of the film tends to be high. If it exceeds 25 vol %, the resistance of the film tends to be high.

Further, in the Ar–$CO_2$ gas system, the $CO_2$ concentration is preferably from about 10 to 50 vol %, as a transparent film having a low electrical resistance can thereby be obtained. If it is less than 10 vol %, the film tends to be colored yellow, and the resistance of the film tends to be high. If it exceeds 50 vol %, the resistance of the film tends to be high.

However, depending upon the particular application, a colored film or high electrical resistance may be required, and accordingly, the respective concentrations may not be limited to the above-mentioned concentrations.

As the sputtering method, any sputtering method such as a DC sputtering method or a RF sputtering method may be employed. Particularly preferred is a DC-sputtering method which is excellent in the industrial productivity.

The transparent conductive film of the present invention can be prepared as follows. Using a magnetron DC sputtering and employing the above-mentioned target, the chamber is evacuated to from about $10^{-7}$ to $10^{-4}$ Torr. If the pressure in the chamber is higher than about $10^{-4}$ Torr, the electrical resistance tends to be hardly controllable under an influence of the moisture remaining in the evacuated chamber. If the pressure in the chamber is lower than $10^{-7}$ Torr, it takes a long time for evacuation, whereby the productivity tends to be poor. The power density (the value obtained by dividing the input power by the area of the target surface) during the sputtering, is preferably from about 1 to 10 W/cm². If it is less than about 1 W/cm², the electrical discharge tends to be instable. ff it exceeds about 10 W/cm², the target is likely to break due to the generated heat.

The sputtering pressure is preferably from $10^{-4}$ to $10^{-1}$ Torr. If it is lower than about $10^{-4}$ Torr or higher than about $10^{-1}$ Torr, the electrical discharge tends to be instable.

As the substrate to be used for the film formation, glass, ceramics, plastics or metals may, for example, be mentioned. The substrate temperature during the film formation is not particularly limited, but it is preferably not higher than about 300° C. so that an amorphous film can readily be obtained.

Further, the substrate temperature may be at a level of room temperature in a case where no intentional heating is carried out.

Further, after the film formation, the substrate may be subjected to post heating (heat treatment) The heat treatment is preferably carried out in atmospheric air from about 60 to 400° C. If it is lower than about 60° C., the effect for lowering the electrical resistance and imparting the stability in resistance by the heat treatment tends to be small. If it is higher than about 400° C., the resistance tends to be inversely high.

Further, the heat treatment can also be carried out in a non-oxidizing atmosphere (such as Ar or nitrogen). The temperature at that time is preferably from about 60 to 600° C. If it is lower than about 60° C., the effect for lowering the electrical resistance and imparting the stability in resistance by the heat treatment, tends to be small. If it is higher than about 600° C., the film tends to be reduced and colored.

In order to obtain high scratch resistance, the film is preferably amorphous. However, even in a case where the film is crystallized to some extent, the bond strength of the crystal boundaries of the transparent conductive film of the present invention is high, whereby high scratch resistance can be obtained.

Further, the transparent conductive film of the present invention is excellent in acid resistance and alkali resistance, and it will scarcely be eroded even by a strong acid or by a strong alkali and will undergo no substantial change in the film resistance. Further, it will scarcely be eroded also by a hydrofluoric acid (HF) aqueous solution and will undergo no substantial change in the film resistance. Further, it has similarly high corrosion resistance also against a fluoride gas such as $CF_4$.

The present invention provides a transparent conductive film-bonded substrate characterized in that a transparent conductive film of tin oxide type containing gallium and indium, is formed on a substrate. This transparent conductive film-bonded substrate is useful as a transparent surface heater or as an antistatic article. Further, it is useful for an antistatic wafer-transporting chuck for producing semiconductors.

The transparent surface heater can be obtained also by directly coating the transparent conductive film of the present invention on glass or on a plastic film. The film thickness is preferably from about 10 to 300 nm from the viewpoint of the resistance value.

The antistatic article can be obtained also by directly coating the transparent conductive film of the present invention on glass or on a plastic film. The film thickness is preferably from about 3 to 100 nm from the viewpoint of the resistance value.

Further, the antistatic wafer transporting chuck for production of semiconductors, can be obtained also by directly coating the transparent conductive film of the present invention on a ceramic chuck. The film thickness is preferably from about 3 to 300 nm from the viewpoint of the resistance value.

In the transparent conductive film-bonded substrate of the present invention, at least one layer of undercoat film may be provided between the transparent conductive film and the substrate for the purpose of adjusting the outer appearance. Otherwise, at least one layer of overcoat film may be provided on the transparent conductive film to adjust the transmitted or reflected color or the visible light reflectance by utilizing the interference phenomenon of light or the absorption phenomenon of the film. As the undercoat or overcoat, a film of an oxide, a nitride or an oxynitride may be employed.

For example, a $SiO_x$ film, a $SiN_x$ film or a $SiO_xN_y$ film is preferred, since it is thereby possible to effectively prevent diffusion of the moisture and oxygen in air to the transparent conductive film of the present invention, or to effectively prevent diffusion of alkali ions such as sodium in the substrate glass to the transparent conductive film of the present invention.

When a target is prepared, gallium oxide and indium oxide will act as assisting agents to accelerate sintering when tin oxide as the main component is sintered. At that time, gallium oxide and indium oxide will strengthen the mutual actions. Further, gallium oxide and indium oxide will act also as additives to impart electrical conductivity to the target. Also in this case, gallium oxide and indium oxide will strengthen the mutual actions to lower the electrical resistance more efficiently.

Further, also in the transparent conductive film of the present invention, gallium oxide and indium oxide will act as additives to impart electrical conductivity to the film, in the same manner as for the-target. Also in this case, gallium oxide and indium oxide will strengthen the mutual actions to lower the electrical resistance more efficiently. Further, gallium oxide and indium oxide will act to make the film amorphous by the impurity effect.

Further, antimony and tellurium will act to increase carrier electrons in the transparent conductive film and the target of the present invention and will lower the electrical resistance of the transparent conductive film and the target of the present invention.

Further, an oxide of a Group 3a element, Group 4a element and a Group 5a element will act as a sintering assistant Further, it has an activity to strengthen the bond, and accordingly, it will act to increase the scratch resistance in the transparent conductive film of the present invention.

The present invention will now be further described by reference to certain Examples which are provided solely for purposes of illustration and are not intended to be limitative.

EXAMPLES

In the following, Examples 1 to 26 and Examples 30 and 31 correspond to Working Examples, and Examples 27 to 29 correspond to Comparative Examples.

Examples 1 to 15

$Ga_2O_3$ powder, $In_2O_3$ powder and $SnO_2$ powder were prepared. and these powders were mixed in the proportions as identified in Table 1 in a dry system ball mill. The target composition shown in Table 1 was calculated from the weighed values of the respective starting material powders. Further, the composition of a sintered body was measured by an ICP method (inductively coupled plasma emission spectrometry) and was confirmed to agree with the composition calculated from the weighed values of the starting material powders. The same applies hereinafter.

The average particle sizes of the powders used were 2.0 μm, 0.8 μm and 1.0 μm with respect to the $Ga_2O_3$ powder, the $In_2O_3$ powder and the $SnO_2$ powder, respectively. These average particles sizes were measured by a microtrack particle size measuring apparatus manufactured by Nikkiso K.K.

The mixed powder was packed into a rubber mold and press-molded by a CIP apparatus, and thereafter, baked in air at a temperature of 1,500° C. under atmospheric pressure for a retention time of 2 hours. The density and the resistivity of this sintered body are shown in Table 1. The density was measured by an Archimedes method. The resistivity was measured by a four terminal method with respect to a prismatic sample of 3×3×30 mm which was cut out.

Then, the above sintered body was cut out in a size of 6 inches in diameter and 5 mm in thickness to obtain a target (hereinafter referred to as a GIT target).

Employing various such GIT targets and using a magnetron DC sputtering apparatus, film formation of $Ga_2O_3$-$In_2O_3$-$SnO_2$ type transparent conductive films (hereinafter referred to as GIT films) was carried out under such conditions that input power: 500 W, introduced gas: Ar–$CO_2$ mixed gas (30 vol % of $CO_2$, when Ar+$CO_2$ was 100 vol %, the total flow rate was 50 sccm), pressure: $4 \times 10^{-3}$ Torr, and substrate temperature: no heating. As the substrate, a soda lime glass substrate (hereinafter referred to simply as a glass substrate) was employed. The operation was carried out so that the film thickness would be about 100 nm.

In Examples 1 to 15, the optimum value for the $CO_2$ concentration was from 10 to 50 vol % (the proportion of $CO_2$ based on the total of Ar and $CO_2$ as introduced gas) by preliminary experiments. Further, in Examples 1 to 15 in Table 2, the test results in the case of $CO_2$: 30 vol % as a representative value, were shown. The resistivities and the transmittances of the respective GIT films thereby obtained, are shown in Table 2.

The film composition in FIG. 2 was measured by an ICP method. The composition of the target and the composition of the GIT film substantially agreed to each other.

Identification of the film was carried out by an X-ray diffractometry. In all of Examples 1 to 15, X-ray diffraction patterns were flat and amorphous. FIG. 1 shows an X-ray diffraction pattern of the GIP film obtained in Example 2.

Examples 16 to 19

A study was made also with respect to a system having $Sb_2O_5$ powder or $TeO_2$ powder added. The blend proportions of the powders were as shown in Table 1.

In the same manner as in Example 1, a target was prepared. The density and the resistivity of this sintered body (target) are shown in Table 1.

Under the same conditions as in Example 1, film formation was carried out using a magnetron DC sputtering apparatus. The composition, the resistivity and the transmittance of the film at that time are shown in Table 2.

The film composition in FIG. 2 was measured by an ICP method. When the composition of the film was compared with the composition of the target, the contents of $Sb_2O_5$ and $TeO_2$ in the film were found to be smaller.

Identification of the film was carried out by an X-ray diffractometry. All of the films of Examples 16 to 19 were amorphous, with their X-ray diffraction patterns being flat.

Examples 20 to 26

A study was made also with respect to a system wherein powders of $Y_2O_3$, $La_2O_3$, $CeO_2$, $Pr_6O_{11}$, $Nd_2O_3$, $TiO_2$ and $Nb_2O_5$ were added as a Group 3a element, a Group 4a element and a Croup 5a element. The blend proportions of the powders were as shown in Table 1.

In the same manner as in Example 1, a target was prepared. The density and the resistivity of this sintered body (target) are shown in Table 1.

Under the same conditions as in Example 1, film formation was carried out using a magnetron DC sputtering apparatus. The composition, the resistivity and the transmittance of the film at that time, are shown in Table 2.

Identification of the film was carried out by an X-ray diffractometry. All of the films of Examples 20 to 26 were amorphous with their X-ray diffraction patterns being flat.

Examples 27 and 28

$Ga_2O_3$ powder, $In_2O_3$ powder and $SnO_2$ powder were prepared, and these powders were mixed in the proportions as identified in Table 1 in a dry system ball mill.

In the same manner as in Example 1, a target was prepared. The density and the resistivity of this sintered body (target) are shown in Table 1.

Using a magnetron DC sputtering apparatus, film formation was carried out under the same conditions as in Example 1 (the same conditions as in Example 1 except that the sputtering gas was an Ar–$O_2$ mixed gas, wherein the proportion of oxygen was 3 vol %, since from the preliminary experiments, it was found that the proportion of oxygen was 3 vol % in order to obtain a transparent film having a low electrical resistance). The composition, the resistivity and the transmittance of the transparent conductive film at that time are shown in Table 2.

The resistivities and the transmittances of the respective transparent conductive films thereby obtained are shown in Table 2.

The film composition in Table 2 was measured by an ICP method. The composition of the target and the composition of the GIT film substantially agreed to each other.

Example 29

A study was carried out also with-respect to an $In_2O_3$-$SnO_2$ powder system. The blend proportions of the powders are as shown in Table 1.

In the same manner as in Example 1, a target was prepared. The density and the resistivity of this sintered body (target) are shown in Table 1.

The target with this composition had high resistance, and DC sputtering was impossible. Therefore, film formation was carried out using a magnetron RF sputtering apparatus. The conditions except for the power source were the same as in Example 27. The resistivity and the transmittance of the film at that time are shown in Table 2. The resistivity was higher than in Examples 1 to 26.

The film composition in Table 2 was measured by an ICP method. The composition of the target and the composition of the GIT film substantially agreed to each other.

Durability Test

In order to examine the acid resistance of the obtained transparent conductive films, the films of Examples 1 to 29 were left to stand respectively in a 5 wt % hydrochloric acid aqueous solution at room temperature for 2 hours. As a result, with respect to any one of the films of Examples 1 to 26, no corrosion of the film or no change in the electrical resistance was observed. The same test was carried out with respect to a 5 wt % sulfuric acid aqueous solution, whereby with respect to any one of the films of Examples 1 to 26, no corrosion or no change in the electrical resistance was observed.

With the film of Example 28, in the hydrochloric acid resistance and sulfuric acid resistance tests, the electrical resistance increased 20% and 10%, respectively.

The change in resistance (%) was obtained by the formula: Change in resistance (%)=((resistance after the test)/(initial resistance)−1)×100.

Further, in order to examine the alkali resistance, the films of Examples 1 to 29 were left to stand respectively in a 5 wt% sodium hydroxide aqueous solution at 80° C. for 30 minutes. As a result, with respect to any one of the membranes of Examples 1 to 26, no corrosion was observed. With respect to any one of the films of Examples 1 to 26, the change in resistance was as small as within from 0 to +5%. With the membrane of Example 27, the resistance increased 45%. With the film of Example 28, the resistance increased 70%.

Further, in order to examine hydrofluoric acid resistance, the films of Examples 1 to 29 were left to stand in a mixed aqueous-solution containing 2 wt % of HF+2 wt % of nitric acid at room temperature for 30 minutes. As a result, with respect to any one of the films of Examples 1 to 26, no corrosion or no change in resistance was observed. The films of Examples 27 and 28 were entirely dissolved.

Further, in order to examine the moisture resistance, the films of Examples 1 to 29 were left to stand respectively in an atmosphere at a temperature of 40° C. with a relative humidity of 90% for 1500 hours. As a result, with respect to any one of the films of Examples 1 to 26, the change in resistance was as small as within ±2%. With the film of Example 28, in the moisture resistance, the electrical resistance increased 10%.

Further, in order to examine the resistance against $CF_4$ gas of the transparent conductive films obtained, with respect to each of the films of Examples 1 to 29, an etching test by $CF_4$ gas was carried out using a sputter etching apparatus under such conditions that RF power: 200W, introduced gas: $CF_4$ (20 sccm), pressure: $10^{-2}$ Torr, and treating time: 30 minutes. As a result, each of the films of Examples 1 to 26 showed high resistance against $CF_4$ gas without being etched. Further, the films of Examples 27 and 28 were entirely etched. The film of Example 29 was not etched.

Further, in order to examine the scratch resistance of the transparent conductive films obtained, with respect to each of the films of Examples 1 to 29, test was carried out using a sand eraser (erasing rubber TYPE 48-100, 5 mm in diameter, manufactured by Plus K.K.) under such conditions that load: 500 g, speed: 50 mm/min, number of times: 5 reciprocations. The evaluation was carried out by four ranks of A: no substantial scratching observed, B: hardly scratchable equal to glass, C: scratchable as compared with glass, and D: substantially scratchable. The transparent conductive films of Examples 1 to 19 were evaluated to be rank B, and the transparent conductive films of Examples 20 to 26 were evaluated to be rank A and found to show high scratch resistance. The films of Examples 27 and 28 were evaluated to be rank C. The film of Example 29 was evaluated to be rank D.

These results are shown in Table 2.

Example 30

The GIT film obtained in Example 2 was subjected to heat treatment in air at 250° C. for 30 minutes. As a result, the resistivity decreased to $1.8 \times 10^{-}\Omega cm$. The visible light transmittance was 82% without change. Further, also with respect to the GIT film obtained in Example 2, heat treatment was carried out in $N_2$ at 500° C. for 30 minutes. As a result, the resistivity decreased to $1.3 \times 10^{-3}$ $\Omega cm$. The visible light transmittance was 82% without change.

Example 31

A GIT film was formed in the same manner as in Example 2 except that the geometrical film thickness of the GIT film was changed to 150 nm.

Then, an electrode and an electrode terminal portion were printed by a screen printing method on the GIT film and baked at 300° C. Then, a lead wire was soldered to the electrode terminal portion.

Then, a glass substrate having the same size was prepared, and this glass substrate and the abovementioned glass substrate having the GIT film formed were sealed by a sealant with a spacer interposed therebetween to obtain a double layer glass.

The visible light transmittance of the double layer glass thus prepared was 80%. The color tone was neutral. The resistance between the bus bar electrodes was measured by lead wires taken out by passing through the sealant, and found to be 135 $\Omega$. A voltage of 32 V was applied across the bus bars to conduct the current conducting test. whereby even after expiration of 6 weeks, the resistance and the outer appearance were constant without change. As described above, the double layer glass was one which excellently functioned as an electrically heated glass.

TABLE 1

| Examples | Target composition | | | | Target density (g/cc) | Target resistivity ($\Omega$ cm) |
|---|---|---|---|---|---|---|
| | $Ga_2O_3$ (mol %) | $In_2O_3$ (mol %) | $SnO_2$ (mol %) | Additive | | |
| 1 | 0.5 | 5 | 94.5 | — | 6.0 | $4 \times 10^{-1}$ |
| 2 | 5 | 5 | 90 | — | 6.5 | $5 \times 10^{-3}$ |
| 3 | 10 | 5 | 85 | — | 6.7 | $5 \times 10^{-3}$ |
| 4 | 20 | 5 | 75 | — | 6.7 | $4 \times 10^{-1}$ |
| 5 | 30 | 5 | 65 | — | 6.5 | $8 \times 10^{-1}$ |
| 6 | 0.5 | 10 | 89.5 | — | 5.8 | $3 \times 10^{-1}$ |
| 7 | 5 | 10 | 85 | — | 6.2 | $5 \times 10^{-3}$ |

TABLE 1-continued

| Exam-ples | Target composition | | | | Target density (g/cc) | Target resistivity (Ω cm) |
|---|---|---|---|---|---|---|
| | $Ga_2O_3$ (mol %) | $In_2O_3$ (mol %) | $SnO_2$ (mol %) | Additive | | |
| 8 | 10 | 10 | 80 | — | 6.2 | $5 \times 10^{-3}$ |
| 9 | 20 | 10 | 70 | — | 6.1 | $5 \times 10^{-2}$ |
| 10 | 30 | 10 | 60 | — | 5.9 | $1 \times 10^{-1}$ |
| 11 | 0.5 | 25 | 74.5 | — | 5.7 | $3 \times 10^{-2}$ |
| 12 | 5 | 25 | 70 | — | 5.9 | $6 \times 10^{-3}$ |
| 13 | 10 | 25 | 65 | — | 6.0 | $6 \times 10^{-3}$ |
| 14 | 20 | 25 | 55 | — | 6.2 | $6 \times 10^{-3}$ |
| 15 | 30 | 25 | 45 | — | 6.3 | $6 \times 10^{-3}$ |
| 16 | 5 | 5 | 89 | $Sb_2O_5$:1 mol % | 6.2 | $3 \times 10^{-3}$ |
| 17 | 5 | 10 | 84 | $Sb_2O_5$:1 mol % | 6.0 | $3 \times 10^{-3}$ |
| 18 | 5 | 5 | 89 | $TeO_2$:1 mol % | 6.1 | $4 \times 10^{-3}$ |
| 19 | 5 | 10 | 84 | $TeO_2$:1 mol % | 5.9 | $4 \times 10^{-3}$ |
| 20 | 5 | 5 | 89.4 | $Y_2O_3$:0.6 mol % | 6.8 | $7 \times 10^{-3}$ |
| 21 | 5 | 5 | 89.5 | $La_2O_3$:0.5 mol % | 6.8 | $8 \times 10^{-3}$ |
| 22 | 5 | 5 | 89.1 | $CeO_2$:0.9 mol % | 6.8 | $8 \times 10^{-3}$ |
| 23 | 5 | 5 | 89.9 | $Pr_6O_{11}$:0.1 mol % | 6.8 | $7 \times 10^{-3}$ |
| 24 | 5 | 5 | 89.6 | $Nd_2O_3$:0.4 mol % | 6.8 | $7 \times 10^{-3}$ |
| 25 | 5 | 5 | 88.1 | $TiO_2$:1.9 mol % | 6.8 | $8 \times 10^{-3}$ |
| 26 | 5 | 5 | 88.9 | $Nb_2O_5$:1.1 mol % | 6.8 | $8 \times 10^{-3}$ |
| 27 | 4 | 87 | 9 | — | 6.8 | $2 \times 10^{-3}$ |
| 28 | 30 | 61 | 9 | — | 5.8 | $5 \times 10^{-3}$ |
| 29 | 0 | 54 | 46 | — | 4.1 | Insulating |

TABLE 2

| Examples | Film composition | | | Film resistivity (Ω cm) | Visible light transmittance of the film (%) | Change in resistance (%) | | | | MR* 40° C. 90% RH 1500 hrs |
|---|---|---|---|---|---|---|---|---|---|---|
| | $Ga_2O_3$ (mol %) | $In_2O_3$ (mol %) | Additive | | | 5 wt % HCl 25° C. 2 hrs | 5 wt % $H_2SO_4$ 25° C. 2 hrs | 5 wt % NaOH 80° C. 30 min | 2 wt % HF + 2 wt % $HNO_3$ 25° C. 30 min | |
| 1 | 0.5 | 5.1 | — | $3 \times 10^{-2}$ | 82 | 0 | 0 | 3 | 0 | −1 |
| 2 | 5.1 | 5.0 | — | $2 \times 10^{-3}$ | 82 | 0 | 0 | 2 | 0 | −1 |
| 3 | 10.1 | 4.9 | — | $3 \times 10^{-3}$ | 82 | 0 | 0 | 2 | 0 | −1 |
| 4 | 20.0 | 5.1 | — | $4 \times 10^{-2}$ | 82 | 0 | 0 | 3 | 0 | 0 |
| 5 | 30.2 | 5.2 | — | $4 \times 10^{-1}$ | 82 | 0 | 0 | 4 | 0 | 1 |
| 6 | 0.5 | 10.0 | — | $3 \times 10^{-2}$ | 82 | 0 | 0 | 3 | 0 | 0 |
| 7 | 4.9 | 10.2 | — | $2 \times 10^{-3}$ | 82 | 0 | 0 | 2 | 0 | 1 |
| 8 | 10.2 | 9.9 | — | $3 \times 10^{-3}$ | 82 | 0 | 0 | 2 | 0 | −1 |
| 9 | 19.9 | 9.9 | — | $2 \times 10^{-2}$ | 82 | 0 | 0 | 3 | 0 | 0 |
| 10 | 29.9 | 10.1 | — | $6 \times 10^{-2}$ | 82 | 0 | 0 | 4 | 0 | 0 |
| 11 | 0.5 | 25.0 | — | $1 \times 10^{-2}$ | 82 | 0 | 0 | 3 | 0 | 0 |
| 12 | 5.0 | 24.9 | — | $4 \times 10^{-3}$ | 82 | 0 | 0 | 3 | 0 | 0 |
| 13 | 9.9 | 25.1 | — | $4 \times 10^{-3}$ | 82 | 0 | 0 | 3 | 0 | 1 |
| 14 | 20.1 | 25.1 | — | $4 \times 10^{-3}$ | 82 | 0 | 0 | 4 | 0 | 1 |
| 15 | 29.8 | 25.0 | — | $4 \times 10^{-3}$ | 82 | 0 | 0 | 5 | 0 | 2 |
| 16 | 5.0 | 4.9 | $Sb_2O_5$:0.1 mol % | $1 \times 10^{-3}$ | 82 | 0 | 0 | 2 | 0 | −1 |
| 17 | 4.9 | 10.1 | $Sb_2O_5$:0.1 mol % | $1 \times 10^{-3}$ | 82 | 0 | 0 | 2 | 0 | 0 |
| 18 | 5.0 | 4.9 | $TeO_2$:0.2 mol % | $1 \times 10^{-3}$ | 82 | 0 | 0 | 2 | 0 | −1 |
| 19 | 5.0 | 9.9 | $TeO_2$:0.2 mol % | $1 \times 10^{-3}$ | 82 | 0 | 0 | 2 | 0 | 1 |
| 20 | 5.0 | 4.9 | $Y_2O_3$:0.6 mol % | $5 \times 10^{-3}$ | 82 | 0 | 0 | 2 | 0 | 2 |
| 21 | 5.0 | 4.9 | $La_2O_3$:0.5 mol % | $5 \times 10^{-3}$ | 82 | 0 | 0 | 2 | 0 | 1 |
| 22 | 5.0 | 4.9 | $CeO_2$:0.9 mol % | $6 \times 10^{-3}$ | 82 | 0 | 0 | 2 | 0 | 0 |
| 23 | 5.0 | 4.9 | $Pr_6O_{11}$:0.1 mol % | $4 \times 10^{-3}$ | 82 | 0 | 0 | 2 | 0 | 1 |
| 24 | 5.0 | 4.9 | $Nd_2O_3$:0.4 mol % | $5 \times 10^{-3}$ | 82 | 0 | 0 | 2 | 0 | −1 |
| 25 | 5.0 | 4.9 | $TiO_2$:1.9 mol % | $6 \times 10^{-3}$ | 82 | 0 | 0 | 2 | 0 | −2 |
| 26 | 5.0 | 4.9 | $Nb_2O_5$:1.1 mol % | $5 \times 10^{-3}$ | 82 | 0 | 0 | 2 | 0 | −1 |
| 27 | 4.0 | 87.0 | — | $4 \times 10^{-4}$ | 82 | 0 | 0 | 45 | Dissolved | −1 |
| 28 | 30.0 | 61.0 | — | $9 \times 10^{-4}$ | 82 | 20 | 10 | 70 | Dissolved | 10 |
| 29 | 0.0 | 54.0 | — | $1 \times 10^{-1}$ | 82 | 0 | 0 | 4 | 0 | 2 |

MR*: Moisture resistance

The present invention provides a tin oxide type transparent conductive film having excellent chemical resistance.

Further, the transparent conductive film obtained by the present invention is amorphous and, accordingly, smooth without surface irregularities, and has, moreover, excellent scratch resistance and electrical conductivity. Accordingly, when used as an overcoat of an insulated article, a highly durable antistatic film is provided. Particularly, a transparent film can be obtained even without heating the substrate, and it can be utilized as an antistatic film having also a function of a protective film, for e.g. a plastic film.

Further, the target of the present invention is electrically conductive and useful for DC sputtering whereby the film forming speed is high. Yet, the target is highly dense, and sputtering can be carried out under stabilized electrical discharge.

Having now described the present invention, it will be apparent that many changes and modifications may be made to the above-described embodiments without departing from the spirit and scope of the present invention.

What is claimed is:

1. A transparent conductive film of tin oxide comprising gallium and indium, which contains, when gallium is calculated as $Ga_2O_3$, indium is calculated as $In_2O_3$ and tin is calculated as $SnO_2$, gallium in an amount of from about 0.1 to 30 mol %, and indium in an amount of from about 0.1 to 30 mol % based on the total amount of $Ga_2O_3$, $In_2O_3$ and $SnO_2$.

2. The transparent conductive film of claim 1, wherein the content of gallium is from about 1 to 15 mol % and the content of indium is from about 1 to 15 mol %.

3. The transparent conductive film of claim 1, which further contains antimony or tellurium or both.

4. The transparent conductive film of claim 3, wherein said antimony or tellurium or both is contained in a total amount of from about 0.01 to 10 mol % based upon a total amount thereof and also $Ga_2O_3$, $In_2O_3$ and $SnO_2$, wherein said amount of antimony or tellurium is calculated as $Sb_2O_5$ or $TeO_2$, respectively.

5. The transparent conductive film of claim 1, which further contains at least one metal selected from the group consisting of Group 3 (inclusive of lanthanoids and not inclusive of actinoids), Group 4 and Group 5 of the long-form Periodic Table.

6. A transparent conductive film-bonded substrate, wherein the transparent conductive film of claim 1 is formed on a substrate.

7. A sputtering target of tin oxide comprising gallium and indium, which contains, when gallium is calculated as $Ga_2O_3$, indium is calculated as $In_2O_3$ and tin is calculated as $SnO_2$, gallium in an amount of from 0.1 to 30 mol %; and indium in an amount of from 0.1 to 30 mol % based on the total amount of $Ga_2O_3$, $In_2O_3$ and $SnO_2$.

8. The sputtering target of claim 7, wherein the content of gallium is from about 1 to 15 mol % and the content of indium is from about 1 to 15 mol %.

9. The sputtering target of claim 7, which contains antimony or tellurium or both.

10. The sputtering target of claim 7, which contains at least one metal selected from the group consisting of Group 3 (inclusive of lanthanoids and not inclusive of actinoids), Group 4 and Group 5 of the long-form Periodic Table.

11. The sputtering target of claim 7, which has a density of at least 5.5 g/cc.

12. The sputtering target of claim 6, wherein said gallium and indium are present as respective oxides thereof each having a particle size of at most about 200 µm.

13. The sputtering target of claim 12, wherein said gallium oxide and indium oxide each have a particle size of at most about 50 µm.

* * * * *